United States Patent
Dick

(10) Patent No.: US 6,281,750 B1
(45) Date of Patent: Aug. 28, 2001

(54) TRANSISTOR AMPLIFIER

(75) Inventor: Burkhard Dick, Hamburg (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/578,269

(22) Filed: May 25, 2000

(30) Foreign Application Priority Data

May 26, 1999 (DE) .............................................. 199 24 107

(51) Int. Cl.[7] ...................................................... H03F 3/45
(52) U.S. Cl. ............................................. 330/252; 330/257
(58) Field of Search ..................................... 330/252, 257, 330/260

(56) References Cited

U.S. PATENT DOCUMENTS

| | | | |
|---|---|---|---|
| 4,331,929 | * 5/1982 | Yokoyama | 330/252 |
| 4,748,420 | * 5/1988 | Metz | 330/252 |
| 5,006,818 | * 4/1991 | Keyama et al. | 330/261 |
| 5,289,136 | * 2/1994 | DeVeirman et al. | 330/252 |
| 5,343,163 | * 8/1994 | Linder et al. | 330/252 |

\* cited by examiner

Primary Examiner—Robert Pascal
Assistant Examiner—Khanh Van Nguyen
(74) Attorney, Agent, or Firm—Steven R. Biren

(57) ABSTRACT

A transistor amplifier is described having a first transistor pair, which comprises a first and a second transistor, and having a second transistor pair, which comprises a third and a fourth transistor, in which the transistors of each pair have their emitter electrodes coupled to each other and to an associated constant current source, the first transistor has its base electrode and its collector electrode coupled to the corresponding electrodes of the third transistor, and the second transistor has its base electrode and its collector electrode coupled to the corresponding electrodes of the fourth transistor, the base electrodes of the first and the third transistor, on the one hand, and the base electrodes of the second and the fourth transistor, on the other hand, being arranged to receive an input signal and an output signal being derivable from the collector electrodes of the transistors, and having a first, a second, a third and a fourth negative-feedback circuit each included in the coupling to the associated constant current source. In an amplifier of this type a high linearity and a low noise level are to be obtained with a circuit of low complexity. In accordance with the invention this is basically achieved in that the first and the fourth negative-feedback circuit each comprise a series arrangement of a plurality of n diode elements and the second and the third negative-feedback circuit each comprise a series arrangement of a plurality of n−1 diode elements, the last-mentioned arrangements being each connected to an input branch of a current mirror circuit. These current mirror circuits comprise output branches whose currents are fed at least partly, as a result of which their noise components do not affect the output signals of the transistor amplifier.

3 Claims, 1 Drawing Sheet

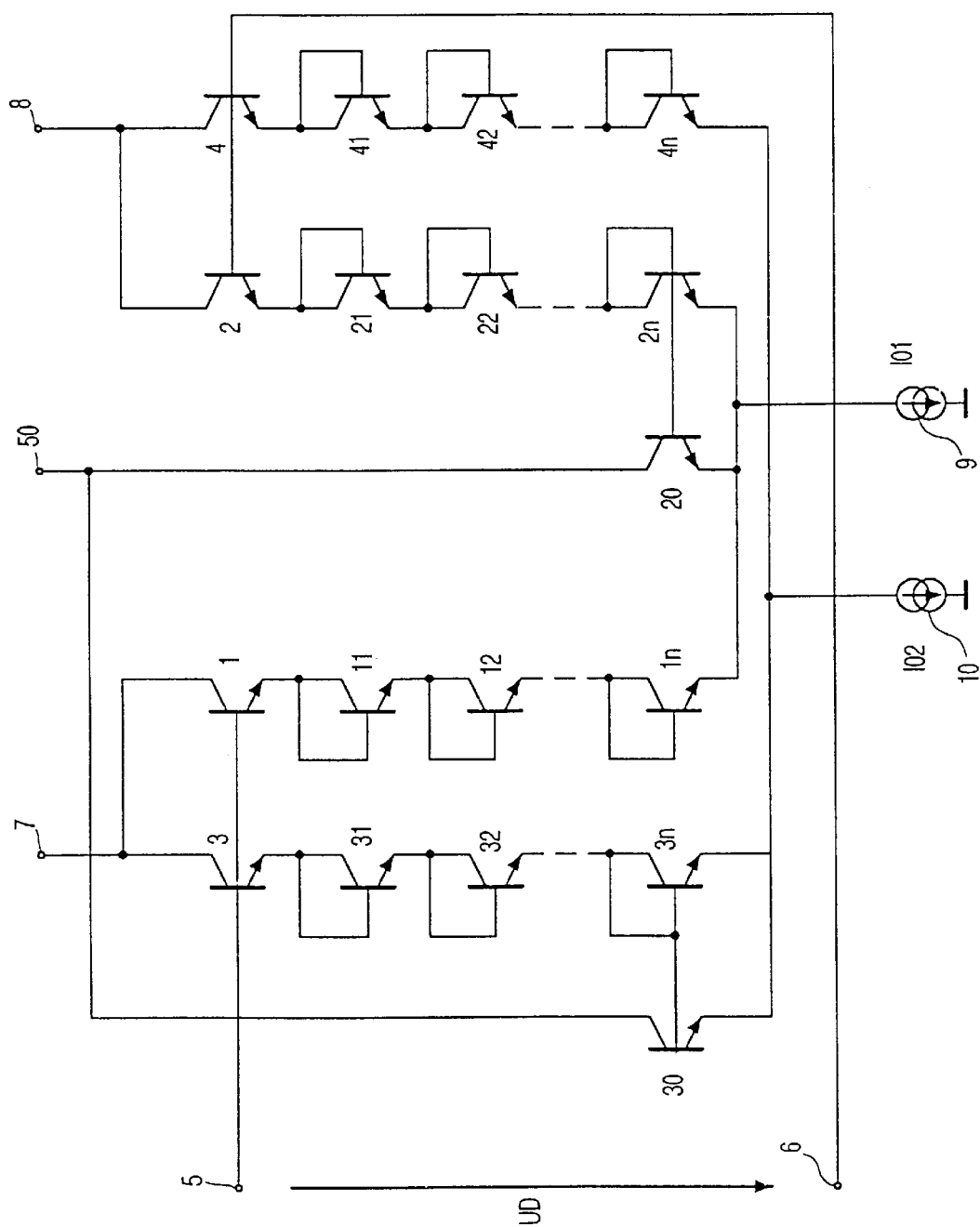

TRANSISTOR AMPLIFIER

BACKGROUND OF THE INVENTION

The invention relates to a transistor amplifier having a first transistor pair, which comprises a first and a second transistor, and having a second transistor pair, which comprises a third and a fourth transistor, in which the transistors of each pair have their emitter electrodes coupled to each other and to an associated constant current source, the first transistor has its base electrode and its collector electrode coupled to the corresponding electrodes of the third transistor, and the second transistor has its base electrode and its collector electrode coupled to the corresponding electrodes of the fourth transistor, the base electrodes of the first and the third transistor, on the one hand, and the base electrodes of the second and the fourth transistor, on the other hand, being arranged to receive an input signal and an output signal being derivable from the collector electrodes of the transistors, and having a first, a second, a third and a fourth negative-feedback circuit each included in the coupling to the associated constant current source.

Differential amplifiers using bipolar circuit technology are generally known. As a rule, a differential amplifier of this kind is a voltage-controlled current source formed by means of two transistors whose emitter electrodes are connected together to a constant-current source. The base electrodes of the transistors then form a differential voltage input and the collector electrodes form a differential current output. The transfer function between the output current and the input voltage is a hyperbolic tangent function. The derivative of this function with respect to the input voltage exhibits a maximum when the input voltage becomes zero. The deviation of this derivative from the maximum value is a measure of the degree of linearity of the differential amplifier. For the described simple differential amplifier the transfer function exhibits a linearity error of 7% when said amplifier is driven with an input voltage of 15 mV (positive or negative). Such a degree of linearity is inadequate to achieve small-error signal processing in the case of comparatively large inputs. However, adding further elements in order to improve the linearity of the described differential amplifier leads to more component parts and to more noise.

DE-OS 30 27 071 discloses a transistor amplifier having a first transistor pair comprising a first and a second transistor as well as a transistor pair comprising a third and a fourth transistor. The transistors of each pair have their emitter electrodes interconnected. Moreover, the first transistor has its base electrode and its collector electrode to the corresponding electrodes of the third transistor and the second transistor has its base electrode and its collector electrode coupled to the corresponding electrode of the fourth transistor. The base electrode of the first and the third transistor, on the one hand, and the base electrode of the second and the fourth transistor, on the other hand are each coupled to a terminal of a low-impedance signal source. The output signal of the transistor amplifier can be derived from the collector currents of the transistors. The common emitter lines of the two transistor pairs include corresponding constant current sources. The transistors are implemented and/or operated in such a manner that the collector direct currents through the first and the fourth transistor are equal to one another and are a factor k of between 2 and 30 times as large or as small as the mutually equal collector direct currents through the second and the third transistor. This is achieved specifically in that the second and the third transistor are identical to one another and each have an emitter area which is a factor k as large as the emitter area of the first and the fourth transistor, which are also identical to one another. Enlarging the emitter areas by a factor k causes the emitter direct current or the collector direct current through the respective transistor to be increased by the factor k. When the value chosen for the factor k is 4, the input voltage for a given third-order harmonic distortion can be around five times as high as the input voltage of a single transistor pair having a constant current source in the common emitter line when the direct currents through the two transistors, i.e. the ratio of their areas, are equal.

Moreover, it is known from DE-OS 30 27 071 to arrange split negative-feedback resistors between the emitter electrodes of the transistor pairs and to connect the constant current sources to the resistor taps. Such a negative-feedback circuit produces larger noise signals and has a lower gain but can also provide a linear amplification for large signals.

From EP 0 352 790 B1 an integrator circuit is known which includes emittercoupled transistor pairs. In these transistor pairs the emitter electrodes of the transistors are each connected to one another and to constant current sources via a diode poled in the forward direction. By means of the diodes the swing of the input signal is substantially doubled in comparison with an integrator circuit without said diodes while the linearity of the integrator circuit is maintained.

From U.S. Pat. No. 3,855,541 it is known that a series arrangement of a given number of diode-coupled transistors which each have an effective emitter area of a size m can be replaced with a transistor circuit including a series arrangement of the same number of diode-coupled transistors but whose effective emitter areas are reduced by the factor m. Moreover, a further transistor has its collector-emitter path arranged in parallel with the series arrangement of transistors in the last-mentioned circuit and has an effective emitter area which is (m−1) times as large as the effective emitter area of each of the transistors of the series arrangement with which said further transistor is arranged in parallel. Furthermore, said further transistor has a base electrode coupled to the base electrode of that transistor of the series arrangement which has its emitter electrode connected to the emitter electrode of the transistor arranged in parallel with the series arrangement.

SUMMARY OF THE INVENTION

It is an object of the invention to construct a transistor amplifier of the type defined in the opening paragraph in such a manner that a high linearity and a low noise level are obtained with a circuit of low complexity.

According to the invention this object is achieved with a transistor amplifier of the type defined in the opening paragraph in that the first, the second, the third and the fourth transistor have at least substantially equal emitter areas, the first and the fourth negative-feedback circuit each comprise a series arrangement of a plurality of n diode elements, each of which is at least substantially similar to the base-emitter junction of the first transistor and the fourth transistor, respectively, the second and the third negative-feedback circuit each comprise a series arrangement of a plurality of n−1 diode elements, each of which is at least substantially similar to the base-emitter junction of the second transistor and the third transistor, respectively, which series arrangements each have one end coupled to the second transistor and the third transistor, respectively, each of the series arrangements in the second negative-feedback circuit and the third negative-feedback circuit, respectively, is connected to the associated constant current source via an input branch of a current mirror circuit, each of the input branches comprises a base-emitter junction which is at least substantially similar to the base-emitter junction of the second transistor and the third transistor, respectively, each of the current mirror circuits comprises at least one output branch coupled to a reference potential, the output branches include base-emitter junctions, and the base-emitter junctions of all the output branches of each time one of the current mirror circuits together have an emitter area which corresponds to a multiple, given by a number m, of the emitter area of the base-emitter junction of the input branch of this current mirror circuit.

The invention thus joins in with the proposals set forth in the prior art to linearize a transistor amplifier, on the one hand, by a mirror-symmetrical coupling of two asymmetrical differential amplifiers or, on the other hand, by means of emitter impedances which act as negative-feedback circuits and which take the form of diodes. It has been found that the linearization attainable with the first-mentioned circuit arrangement in accordance with DE 30 27 071 A1 cannot meet satisfactory linearity requirements, which also applies to the diode negative-feedback circuits in accordance with EP 0 352 790 B1. Increasing the negative feedback in accordance with the last-mentioned document by arranging a plurality of diodes in series in each negative-feedback circuit leads to an increased circuit complexity and to a larger voltage drop in the emitter branches of the differential amplifier, which becomes particularly problematic in the case of low supply voltages. Moreover, each additional diode element, i.e. base-emitter junction, results in an increase of the noise produced by the amplifier. Neither is it possible to achieve an improvement as regards the noise and the voltage drop when a negative-feedback circuit in the form of a diode chain in accordance with U.S. Pat. No. 3,855,541 is substituted. Anyhow, this would reduce the area required for the negative-feedback circuits.

The invention utilizes the proposals of the three aforementioned documents as the state of the art but goes beyond merely combining said proposals. The transistor amplifier having two asymmetrical differential amplifiers is then connected to negative-feedback circuits in the emitter branches, which negative-feedback circuits include series arrangements of diodes. However, these series arrangements of diodes, including the transistors of the transistor pairs, all have only small emitter areas. On the one hand, this saves semiconductor area and, on the other hand, a high degree of linearization is achieved with a few series-connected diode elements in the negative-feedback circuits. According to the invention, the output currents of the current mirror circuits provided in the second and the third negative-feedback circuit in analogy to the proposal in U.S. Pat. 3,855,541 are not comprised in the output currents of the transistor amplifier but are at least partly, but preferably wholly applied to a reference potential, which is preferably formed by a supply voltage terminal. Consequently, the currents thus drained can no longer influence the noise of the output currents of the transistor amplifier. Thus, the invention provides a low-noise transistor amplifier having a low circuit complexity and a high linearity, which can also be used at low supply voltages.

In an advantageous embodiment of the transistor amplifier in accordance with the invention the value m is at least substantially equal to 3. In effect, this corresponds to a ratio between the emitter areas of the transistors of the individual transistor pairs of at least substantially 1:4. Thus, a particularly good linearity is obtained because the third-order non-linear signal components are eliminated.

Transistor amplifiers of the type in accordance with the invention are particularly suitable for use in electrical communication apparatuses, in which only a small signal corruption is permissible, for example for a high-quality audio signal processing.

BRIEF DESCRIPTION OF THE DRAWING

The FIGURE shows an example of a transistor amplifier embodying the invention.

DESCRIPTION OF THE PREFERRED EMBODIMENTS

The amplifier includes a first transistor 1, a second transistor 2, a third transistor 3 and a fourth transistor 4, the first and the second transistor 1, 2 forming a first transistor pair and the third and the fourth transistor 3, 4 likewise forming a second transistor pair. The first and the third transistors 1, 3 have their base electrodes connected to a first input terminal 5.

The second and the fourth transistor 2, 4 have their base electrodes connected to a second input terminal 2, 4. An input signal in the form of a voltage DU is applied to the input terminals 5, 6.

The first and the third transistor 1,3 further have their collector electrodes connected to a first output terminal 7. The second and the fourth transistor 2, 4 likewise have their collector electrodes connected to the second output terminal 8. In operation an output signal can be taken from the commoned collector electrodes, i.e. from the output terminals 7, 8, the first output terminal 7 forming a non-inverting output and the second output terminal 8 forming an inverting output.

The transistors 1, 2 and 3, 4 of the transistor pairs have their emitter electrodes coupled to a respective constant current source 9 or 10, the first transistor pair 1, 2 being associated with a first one of these constant current sources referenced 9 and the second transistor pair being associated with the second constant current source 10. The first constant current source 9 supplies a direct current I01 and the second constant current source 10 supplies a direct current 102.

The respective couplings of the emitter electrodes 1,2, 3, 4 to the associated constant current sources 9 and 10 each include a negative feedback circuit. A first one of these negative-feedback circuits comprises a plurality of n diode elements, of which the diode elements referenced 11, 12 and In are shown in the Figure. The diode elements 11, 12, In, which may be provided in an arbitrary number, are arranged in series with one another and in the present example they are preferably formed by transistors having their respective collector electrodes and base electrodes short-circuited. Likewise, a second negative-feedback circuit between the emitter electrode of the second transistor 2 and the first constant current source 9 includes a series arrangement of an equal number n of diode elements referenced 21, 22, 2n. A third negative-feedback circuit between the emitter electrode of the third transistor 3 and the second constant current source 10 includes a series arrangement of an equal number n of diode elements referenced 31, 32, 3n. The fourth one of the negative-feedback circuits includes a series arrangement of again n diode elements 41, 42, 4n, arranged between the emitter electrode of the fourth transistor 4 and the second constant current source 10. In these negative-feedback circuits the respective diode elements at least substantially correspond to the respective base-emitter junctions of the first, the second, the third and the fourth transistor 1, 2, 3 or 4 connected to them. Preferably, all these diode elements or base-emitter junctions are at least substantially identical and, in particular, they have at least substantially corresponding emitter areas.

In the series arrangements of diode elements the diode elements 11, 21, 31, 41 may, notionally, also be combined as a first diode stage, the diode elements 12, 22, 32, 42 as a second diode stage etc.

In the second negative-feedback circuit the diode element $2n$ forms an input branch of a current mirror circuit whose output branch is formed by a transistor 20. When the diode element $2n$ and the transistor 20 are notionally combined as a current mirror circuit, the other diode elements 21, 22 etc. may notionally be combined as a series arrangement of a plurality of n−1 diode elements. Then, this series arrangement of n−1 diode elements has one end coupled to the emitter electrode of the second transistor 2 and its other end to the input branch $2n$ of the current mirror circuit 20, $2n$.

Likewise, the third negative-feedback circuit includes a transistor 30 as the output branch of a current mirror circuit comprising this transistor 30 and the diode element $3n$, the diode elements 31, 32 etc. forming a series arrangement of n−1 diode elements.

For the sake of clarity the Figure shows a version having one emitter electrode and one collector electrode both for the transistor 20 and for the transistor 30. In contrast with the transistors 1, 2, 3, 4 and the diode elements 11, 12 etc. to $4n$, which are all constructed as transistors having at least substantially equal emitter areas, the transistors 20, 30 have emitter areas which correspond to a multiple, defined by a number m, of the emitter areas of the input branches $2n$ and $3n$ of the current mirror circuits. The number m thus represents the mirror ratio of the current mirror circuits $3n$, 30 and $2n$, 20. If instead of the transistors 20 and 30 multiple transistors are used, the number m defines the ratio of the sum of the emitter areas of all the transistors which together correspond to the transistor 20 and 30, respectively, to the emitter area of the associated input branch $2n$ and $3n$, respectively.

In the present example the emitter electrode of the transistor 20 of the second negative-feedback circuit and the emitter electrode of the input branch are together connected to the first constant current source 9. Likewise, the emitter electrode of the transistor 30 and the emitter electrode of the input branch $3n$ are connected to the second constant current source 10. The collector electrodes of the transistors 20 and 30 are together connected to a terminal 50 which carries a reference potential, preferably a supply voltage.

In the present transistor amplifier all the transistors or diode elements formed by transistors, except for the output branches 20, 30 of the current mirror circuits have correspondingly small emitter areas, as a result of which this circuit arrangement requires a small area on a semiconductor crystal. The signal currents which flow through the transistors 1, 2, 3, 4 and the series arrangements of the diode elements 11, 12 . . . $4n$ are comparatively small and the noise signals from these circuit elements which reach the output terminals 7, 8 are comparatively small. Conversely, the larger noise components are fed to the terminal 50 via the output branches 20, 30 of the current mirror circuits.

In a modification of the present example of the transistor amplifier, in which the output branches 20, 30 are constructed as multiple transistors or a multiplicity of transistors arranged in parallel, individual collector electrodes thereof may be connected to the terminal 50 and the other collector electrodes may be connected to the output terminals 7 and 8, respectively. Thus, the output currents of the current mirror circuits, with their noise components, are applied only partly to the terminal 50 but the remainder of the output currents are applied to the output terminals 7 and 8, respectively. This results in a higher noise level at these terminals. Therefore, the variant of the circuit arrangement forms an optimum solution with regard to the desired noise characteristics.

Moreover, a particularly favorable linearization is achieved if the number m is at least substantially equal to 3, i.e. if the overall emitter area of the transistor 20 corresponds to three times the emitter area of the input branch $2n$, and if likewise the overall emitter area of the transistor 30 corresponds to three times the emitter area of the input branch $3n$.

What is claimed is:

1. A transistor amplifier having a first transistor pair, which comprises a first and a second transistor, and having a second transistor pair, which comprises a third and a fourth transistor, in which the transistors of each pair have their emitter electrodes coupled to each other and to an associated constant current source, the first transistor has its base electrode and its collector electrode coupled to the corresponding electrodes of the third transistor, and the second transistor has its base electrode and its collector electrode coupled to the corresponding electrodes of the fourth transistor, the base electrodes of the first and the third transistor, on the one hand, and the base electrodes of the second and the fourth transistor, on the other hand, being arranged to receive an input signal and an output signal being derivable from the collector electrodes of the transistors, and having a first, a second, a third and a fourth negative-feedback circuit each included in the coupling to the associated constant current source, characterized in that the first, the second, the third and the fourth transistor have at least substantially equal emitter areas, the first and the fourth negative-feedback circuit each comprise a series arrangement of a plurality of n diode elements, each of which is at least substantially similar to the base-emitter junction of the first transistor and the fourth transistor, respectively, the second and the third negative-feedback circuit each comprise a series arrangement of a plurality of n−1 diode elements, each of which is at least substantially similar to the base-emitter junction of the second transistor and the third transistor, respectively, which series arrangements each have one end coupled to the second transistor and the third transistor, respectively, each of the series arrangements in the second negative-feedback circuit and the third negative-feedback circuit, respectively, is connected to the associated constant current source via an input branch of a current mirror circuit, each of the input branches comprises a base-emitter junction which is at least substantially similar to the base-emitter junction of the second transistor and the third transistor, respectively, each of the current mirror circuits comprises at least one output branch coupled to a reference potential, the output branches include base-emitter junctions, and the base-emitter junctions of all the output branches of each time one of the current mirror circuits together have an emitter area which corresponds to a multiple, given by a number m, of the emitter area of the base-emitter junction of the input branch of this current mirror circuit.

2. A transistor amplifier as claimed in claim 1, characterized in that the number m is at least substantially equal to 3.

3. An electrical communication apparatus, characterized by a transistor amplifier as claimed in claim 1 or 2.

* * * * *